US007408425B2

(12) United States Patent
Zabinski et al.

(10) Patent No.: US 7,408,425 B2

(45) Date of Patent: Aug. 5, 2008

(54) DIFFERENTIAL SIGNAL TERMINATION BLOCK

(75) Inventors: Patrick Zabinski, Stewartville, MN (US); Rick Philpott, Rochester, MN (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 208 days.

(21) Appl. No.: 11/327,908

(22) Filed: Jan. 9, 2006

(65) Prior Publication Data

US 2006/0158278 A1 Jul. 20, 2006

Related U.S. Application Data

(60) Provisional application No. 60/644,351, filed on Jan. 14, 2005.

(51) Int. Cl.
*H03H 7/38* (2006.01)
*H01P 1/00* (2006.01)

(52) U.S. Cl. ...................................... 333/33; 333/24 R

(58) Field of Classification Search .................. 333/32, 333/33, 22 R, 25, 26, 24 R
See application file for complete search history.

(56) References Cited

U.S. PATENT DOCUMENTS

| | | | | |
|---|---|---|---|---|
| 5,475,346 | A * | 12/1995 | Mullett | 333/25 |
| 5,789,994 | A | 8/1998 | Case et al. | |
| 6,900,710 | B2 | 5/2005 | Agoston et al. | |

* cited by examiner

*Primary Examiner*—Stephen E Jones
(74) *Attorney, Agent, or Firm*—Quarles & Brady LLP

(57) ABSTRACT

A termination block provides a pair of coaxial connectors for a differential signal source and a pair of coaxial connectors for connection to a single ended coaxial input. Passive electrical components provide impedance matching while maintaining phase-matched true and complement signal paths for the differential signal.

20 Claims, 3 Drawing Sheets

DIFFERENTIAL SIGNAL TERMINATION BLOCK

CROSS-REFERENCE TO RELATED APPLICATIONS

This application is based on U.S. Provisional Patent Application Ser. No. 60/644,351 filed on Jan. 14, 2005 and entitled "DIFFERENTIAL SIGNAL TERMINATION BLOCK."

BACKGROUND OF THE INVENTION

As the demand for higher performance electronics continues to push data rates beyond 1 GHz, there is a growing trend to use differential signal protocols in electronics. Yet, there is a lack of appropriate test equipment being developed to properly characterize such signals.

Specifically, the majority of developing differential signal protocols are developed around the concept of considering only the differential portion of the signal and suppressing and ignoring the common-mode portion of the signal. By doing so, shifts in common-mode voltage, balanced impedance discontinuities in interconnect, and noise from outside sources can often be of little consequence to the serial link performance. Accordingly, many transmission line drivers and receivers provide good differential impedance match between the true and complement signal while the common-mode impedance match is often quite poor.

In contrast, the vast majority of available test equipment is designed with coaxial connections that are inherently best suited for single ended signal protocols. Through the use of two such coaxial connectors, the equipment can provide or capture differential signals by considering only the difference between these two connection points through internal circuitry. With the use of single-ended connectors, the test equipment typically terminates the connections with 50 ohm resistors to ground. Looking at the difference in potential between the true and complement ports, a 100 ohm series resistance can be measured and is sometimes adequate termination for the incoming differential signal.

The disparity between the terminations and impedance matching approaches used in the differential signal protocols and the test equipment with single ended test equipment can sometimes cause problems. For example, low voltage differential signaling drivers assume a far-end termination of 100 ohms between the true and complement differential signals with a high impedance to ground potential. When such a driver is connected to typical test equipment with a 50 ohm single-ended resistance to ground, the driver output signal swing is degraded, the common mode voltage is reduced, and the signal shape is distorted. Similarly, when a function generator or similar test equipment which is expecting a 50 ohm termination to ground drives a low voltage differential signaling receiver having a 100 ohm termination between its differential inputs, the signals are distorted in shape, level, and swing.

SUMMARY OF THE INVENTION

The present invention is a termination block for coupling a differential signal device to a single ended signal device. The termination block is comprised of a housing that supports coaxial connectors and passive circuit elements which provide a balanced load on the differential signal and a matched impedance on the single-ended signal device. The connectors and passive elements in the true and complement signal paths of the differential signal are phase-matched to one another to maintain a high signal quality by maintaining symmetry about a central plane disposed between the differential signal paths.

DETAILED DESCRIPTION OF THE PREFERRED EMBODIMENT

Figure 1:
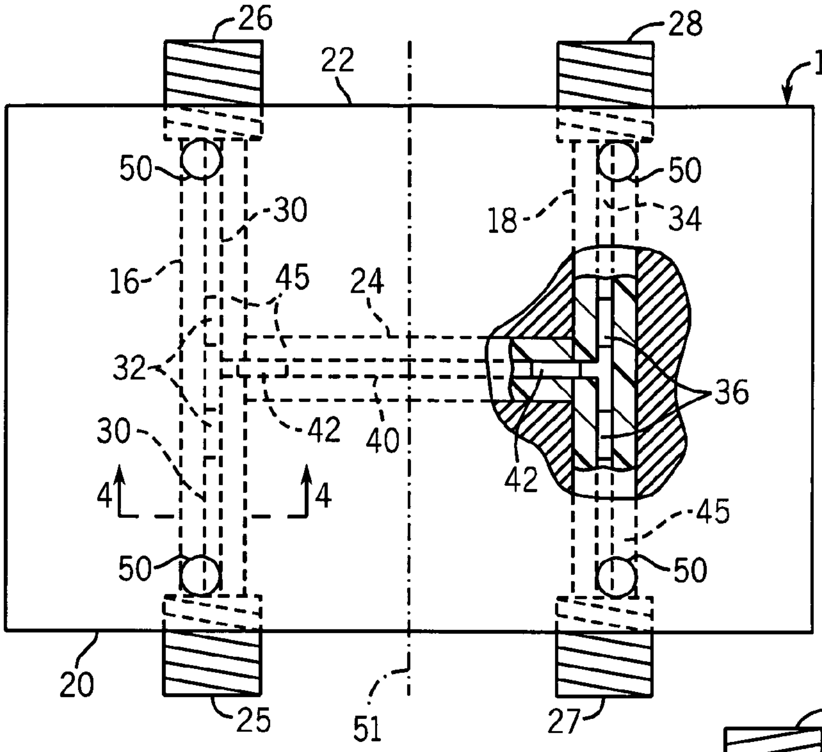
FIG. 1 is a top view with part cut away of a first preferred embodiment of a termination block according to the present invention.
Figure 2:
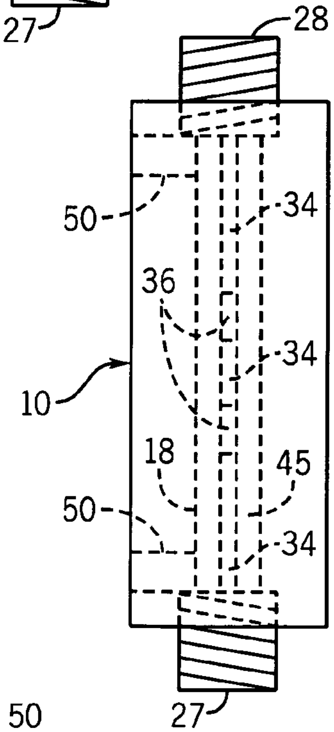
FIG. 2 is a side view of the termination block in FIG. 1.
Figure 3:
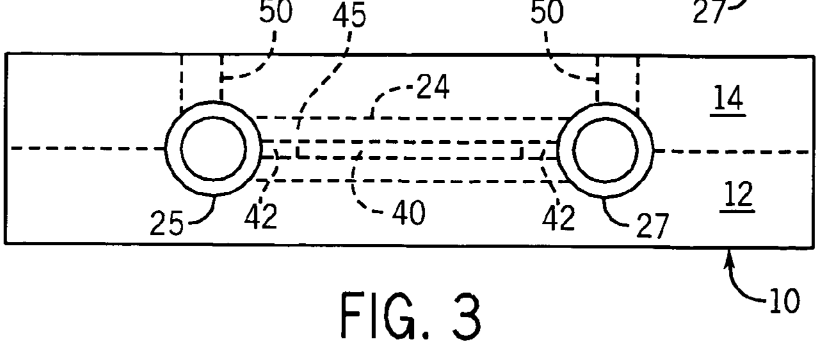
FIG. 3 is a front view of the termination block of FIG. 1.
Figure 4:
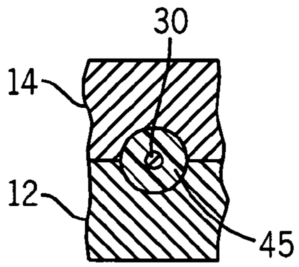
FIG. 4 is a partial view in cross-section taken along the plane 4-4 indicated in FIG. 1.

Referring particularly to FIGS. 1-4, a preferred embodiment of the invention is a termination block having a housing 10 formed by two substantially identical, rectangular components that form a lower base 12 and a top 14. The components 12 and 14 are formed from metal and act as a shield to the electronic components contained therein. At the juncture of the top 14 and base 12 three circular-shaped channels are formed to support the electronic components. More specifically, a pair of parallel channels 16 and 18 extend completely through the housing 10 from its input side 20 to its output side 22, and a cross-channel 24 connects the parallel channels 16 and 18 at their midpoints. The resulting "H" shaped channel within the housing 10 has two openings to the input side 20 of the housing 10 and two openings on its output side 22.

Coaxial connectors 25-28 are mounted in these four openings to make electrical connections between the electronic components within the housing 10 and external circuitry (not shown in the drawings). Any of a number of different types of connectors can be used depending on the particular application such as K connectors (Model K102F) commercially available from Anritsu Company which are rated from DC through 40 gHz.

The electronic components in the housing 10 is a set of resistor elements electrically connected by metallic rods. More specifically, a metallic rod 30 is mounted coaxially in the parallel channel 16 and extends between connectors 25 and 26. The rod 30 is interrupted by passive resistive elements 32 that are also coaxial with the channel 16 and soldered securely to segments of the rod. The number of resistors 32 and their values will depend on the particular circuit used as will be described in more detail below.

Similarly, a metal rod 34 is mounted coaxially in the channel 18 and extends between connectors 27 and 28. Passive resistor elements 36 are soldered to the metal rod 34 and interrupt the direct conductive path it forms between connectors 27 and 28. As with resistors 32, the number and values of resistors 36 will depend on the particular application of the terminal block.

A connecting rod 40 and passive resistor elements 42 are mounted coaxially in the cross channel 24. The connecting rod 40 electrically connects between the conductive rods 30 and 34 at their midpoints and the resistor elements 42 are soldered to the connecting rod segments and interrupt the direct connection. The number of resistors 42 used and the values thereof will depend on the particular application as described below.

The rods 30, 34 and 40 as well as the resistors they support are disposed coaxially in the channels 16, 18 and 24 and interconnect the four connectors 25-28. These elements are surrounded by a dielectric insulating material 45 which fills the annular spaces around them. Four fill holes 50 are formed through the top 14 to enable the dielectric material to be injected in liquid form into the channels 16, 18 and 24 after the terminal block is assembled. The fill holes 50 are located near each connector 25-28 so that when the dielectric material is injected through one of the fill holes 50, it flows through all the channels and pushes air out through the other three fill holes 50. A dielectric material such as RTP 100 polypropylene (PP) commercially available from the RTP Company of Winona, Minn. may be used and it hardens after injection into the channels 16, 18 and 24.

A very rigid and symmetrical structure is thus formed to insure precise phase matching for the differential signal across connectors 25 and 27. More specifically, the termination block is electrically symmetrical about a central plane indicated at 51 in FIG. 1. The central plane 51 passes through the housing 10 midway between the differential input connector 25 and 27 and midway between output connectors 26 and 28. The electrical symmetry is secured in the preferred embodiment by also laying out the components and supporting structures such that they are also physically symmetrical about the central plane 51.

Figure 5:
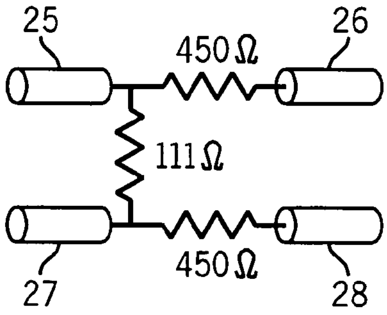
FIGS. 5 and 6 are circuit diagrams of two preferred sets of electrical components used in the termination block of FIG. 1.

A number of different circuit component configurations can be used in the terminal block structure of FIG. 1. Referring particular to FIG. 5, a first embodiment presents a matching differential impedance at the input across connectors 25 and 27 when the output connectors are terminated to a single-ended signal device. It includes three passive resistive elements having values of 450 Ω, 111 Ω and 450 Ω. This embodiment presents a 100 ohm differential input impedance to a differential signal device connected across the connectors 25 and 27 and a 50 ohm single-ended output impedance to a single-ended signal device connected to connector 26 or 28. The common-mode impedance to ground across the differential input connectors 25 and 27 is 450+50=500 ohms, which is significantly higher than the 50 ohms seen with a direct connection to a single-ended signal device. This high input impedance avoids "pulling-down" differential signals and distorting them. The signal at output connectors 26 and 28 is one tenth the signal across input connectors 25 and 27. To maintain balanced impedance at the differential inputs, a 50 ohm termination cap is fastened to the unused single-ended connector 26 or 28 when only one connector 26 or 28 is needed.

Figure 6:
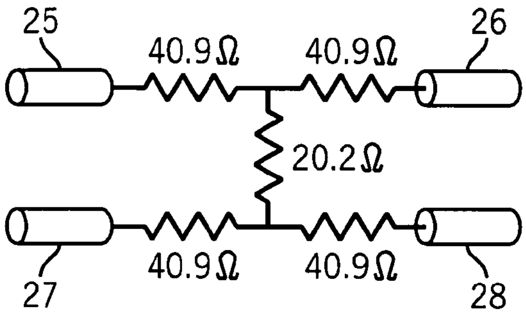

A variation of this circuit is shown in FIG. 6. Here the circuit is symmetric and the input across connectors 25 and 27 and the output at connectors 26 and 28 are treated the same. This embodiment includes five passive resistive elements having values of 40.9 Ω, 40.9 Ω, 20.2 Ω, 40.9 Ω and 40.9 Ω. This circuit enables bidirectional connection between driving and driven circuitry. With the smaller series resistor values, the common-mode impedance to ground is 40.9+40.9+50=131.8 ohms. The differential signal at connectors 26 and 28 is one tenth the differential signal applied across connectors 25 and 27, and when driven in the other direction, the differential signal across connectors 25 and 27 is one-tenth the signal applied to either connector 26 or 28 when the output connectors are terminated to a single-ended signal device.

Figure 7:
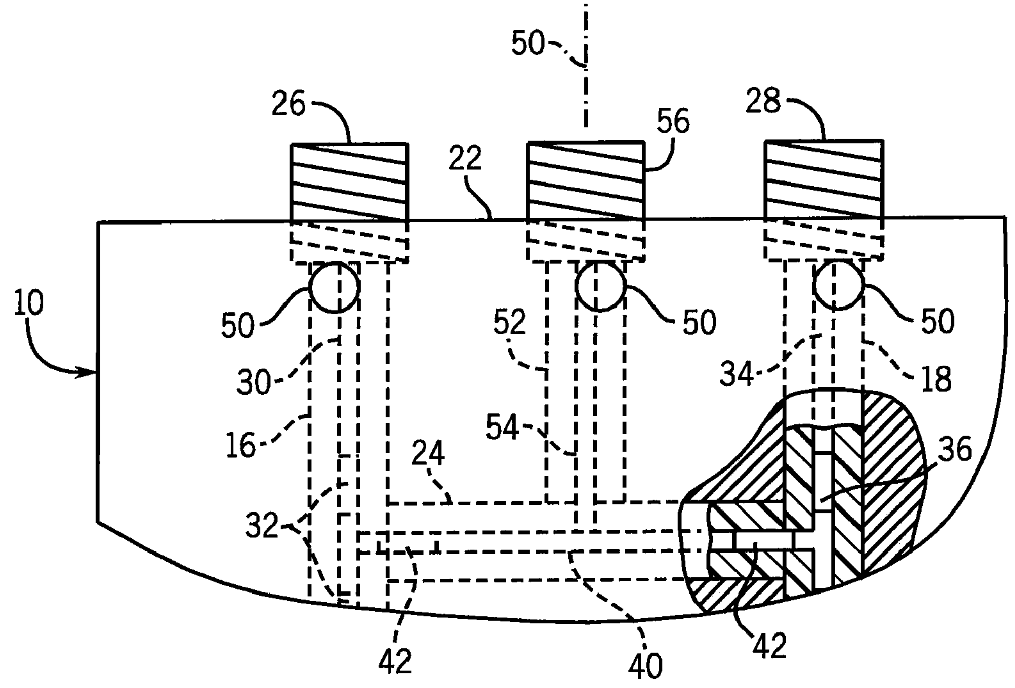
FIG. 7 is a partial top view with part cut away of an alternative embodiment of a termination block according to the present invention.

An alternative embodiment of the terminal block is illustrated in FIG. 7 which enables a number of additional circuits to be used. In this alternative embodiment the structure is the same as that described above except a third parallel channel 52 is formed in the housing 10 midway between the channels 16 and 18 on the output side of the housing 10. A metallic rod 54 extends along the centerline of the channel 52. The rod 54 connects the mid point on the conductive rod 40 to a coaxial connector 56 mounted to the output side of the housing 10. As with the other parallel channels, a fill hole 50 is formed near the connector 56 to enable the annular space around the rod 54 to be filled with a dielectric insulating material. In addition, the coaxial connector 56 and the conductive rod 54 are disposed in the central plane 51 so as not to upset the symmetry thereabout.

Figure 8:
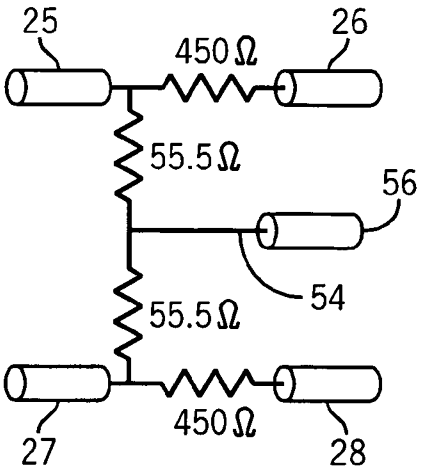
FIGS. 8 and 9 are circuit diagrams of two preferred sets of electrical components used in the termination block of FIG. 7.

The additional channel 52 and connector 56 enable common-mode signal control. Referring to the embodiment in FIG. 8 the conductive rod 54 enables the common-mode point to be set to a specific DC voltage. This is accomplished by connecting a DC bias source of the desired voltage level to the connector 56.

Figure 9:
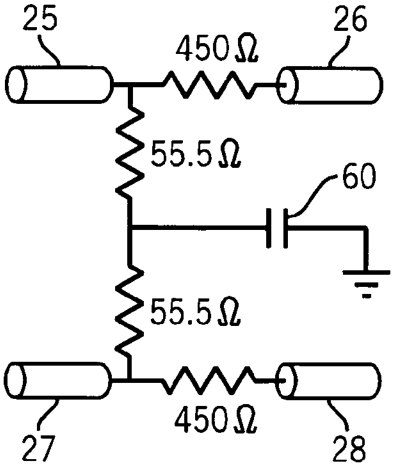

And yet another embodiment of the invention enables common-mode decoupling. Referring to FIG. 9, in some test environments high levels of common-mode noise are produced and the attached equipment is sensitive to common-mode noise. To alleviate some of these problems a capacitor 60 is connected between the common-mode point and circuit ground. This capacitor 60 can be an external component connected to the connector 56, or it can be inserted at a break in the conductive rod 54 and located inside the housing 10 as one of the passive electrical components.

Figure 10:
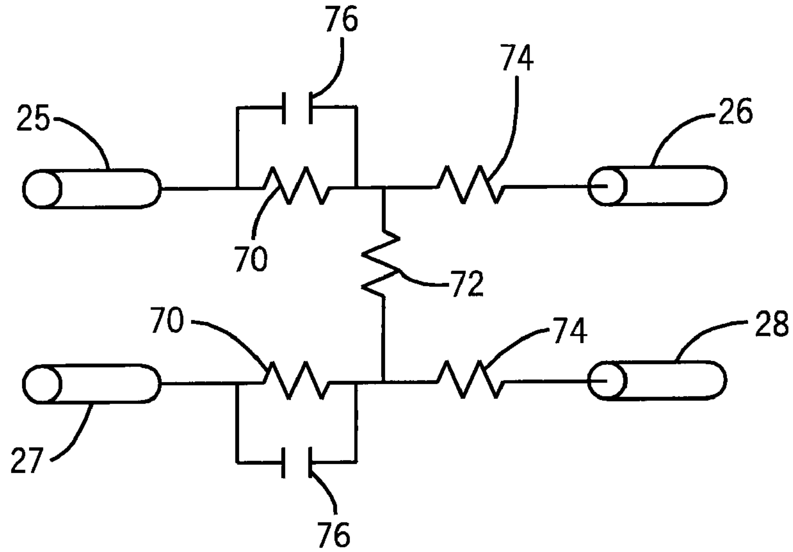
FIG. 10 is a circuit diagram of a preferred set of electrical components used in the termination block of FIG. 1.

Another embodiment of the invention provides not only balanced impedance matching, but also passive equalization to the differential signal across connectors 25 and 27. Referring to FIG. 10, resistors 70 connected to differential signal connectors 25 and 27 cooperate with parallel connected capacitors 76 to provide a high-pass transfer function that frequency compensates for the low-pass transfer function associated with lossy transmission lines that connect to the termination block. The values of resistors 70 and the remaining resistors 72 and 74 are selected to provide the desired impedance matching and the value of capacitors 76 is selected to provide the desired frequency compensation.

It should be apparent that many variations are possible without departing from the spirit of the invention. While the physical construction described above is preferred, other constructions are possible. For example, the conductive paths and passive electronic components can be formed as a circuit on an insulating substrate, and the substrate firmly mounted within the housing and electrically attached to the coaxial connectors. The layout of the circuit on the substrate should be such that the geometric and electrical symmetry is maintained about the central plane 51.

The invention claimed is:

1. A termination block for coupling a differential signal device and a single ended signal device, the combination comprising:

a housing;

a first pair of coaxial connectors mounted to one side of the housing for coupling to the differential signal device;

a second pair of coaxial connectors mounted to another side of the housing for coupling to the single ended signal device; and an electrical circuit comprised of elements that connect between the first pair of coaxial connectors and the second pair of coaxial connectors, the electrical circuit providing impedance matching between a differential signal device connected to the first pair of coaxial connectors and a single-ended signal device connected to one of said second coaxial connectors, and the electrical circuit being symmetrical about a central plane passing midway between the first pair of coaxial connectors and the second pair of coaxial connectors.

2. The termination block as recited in claim 1 in which the elements are passive elements that are disposed in the housing physically symmetrical about the central plane.

3. The termination block as recited in claim 1 in which the electrical circuit includes:

a pair of conductors extending between and electrically connecting respective ones of the first coaxial connectors to respective ones of the second coaxial connectors; and a cross conductor which extends between and electrically connects the pair of conductors;

wherein passive elements are disposed in the conductive paths formed by the pair of conductors.

4. The termination block as recited in claim 3 in which a passive element is also disposed in the conductive path formed by the cross conductor.

5. The termination block as recited in claim 4 in which the cross conductor connects at substantially the midpoint of the pair of conductors.

6. The termination block as recited in claim 5 in which two passive resistive elements are disposed in each of said pair of conductors, one to each side of said midpoint connection with the cross conductor.

7. The termination block as recited in claim 6 in which a passive resistive element is disposed in the cross conductor.

8. The termination block as recited in claim 7 in which each passive resistive element in the pair of conductors is 40.9 ohms and the passive resistive element in the cross conductor is 20.2 ohms.

9. The termination block as recited in claim 7 in which a passive capacitor element is disposed in each of said pair of conductors to frequency compensate a signal coupled between the first pair and the second pair of coaxial connectors.

10. The termination block as recited in claim 9 in which the passive capacitor elements are electrically connected in parallel with passive resistive elements in their respective conductors.

11. The termination block as recited in claim 3 in which a passive resistive element is disposed in each of the conductors and a passive resistive element is disposed in the cross conductor.

12. The termination block as recited in claim 11 in which the passive resistive element in each of said pair of conductors is 450 ohms and the passive resistive element in the cross conductor is 111 ohms.

13. The termination block as recited in claim 3 in which the passive elements include a resistor and capacitor having values selected to frequency compensate a signal coupled between the first pair and the second pair of coaxial connectors.

14. The termination block as recited in claim 3 in which the housing is comprised of a top and a base which form channels for said conductors when assembled.

15. The termination block as recited in claim 14 in which the conductors are metal rods disposed in the channels.

16. The termination block as recited in claim 15 in which the channels form an H pattern within the housing.

17. The termination block as recited in claim 15 in which the top and base are metallic and the channels are filled with a dielectric insulating material that surrounds the conductors therein.

18. The termination block as recited in claim 3 which includes:

a fifth coaxial connector mounted to the housing and disposed in the central plane; and a conductive path connected between the fifth coaxial connector and the cross conductor and being disposed in the central plane.

19. The termination block as recited in claim 18 in which a passive resistive element is connected in each of the pair of conductors.

20. The termination block as recited in claim 18 in which two passive resistive elements are disposed in the cross conductor, one to each side of the central plane.

* * * * *

UNITED STATES PATENT AND TRADEMARK OFFICE

CERTIFICATE OF CORRECTION

PATENT NO. : 7,408,425 B2
APPLICATION NO. : 11/327908
DATED : August 5, 2008
INVENTOR(S) : Patrick Zabinski et al.

It is certified that error appears in the above-identified patent and that said Letters Patent is hereby corrected as shown below:

Col. 1
Please insert new paragraph after lines 8-9 should read,

--STATEMENT REGARDING FEDERALLY SPONSORED RESEARCH
[0002] This invention was made with government support under contract MDA904-03-C-1400 awarded by the Maryland Procurement Office. The Government has certain rights in the invention.--

Signed and Sealed this

Seventh Day of October, 2008

JON W. DUDAS
*Director of the United States Patent and Trademark Office*